(12) United States Patent
Wang

(10) Patent No.: US 11,315,983 B2
(45) Date of Patent: Apr. 26, 2022

(54) DISPLAY PANEL INCLUDING MULTIPLE PIXEL UNITS AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Deqi Wang, Wuhan (CN)

(*) Notice: Subject to any disclaimer, the term of this patent is extended or adjusted under 35 U.S.C. 154(b) by 234 days.

(21) Appl. No.: 16/629,321

(22) PCT Filed: Oct. 21, 2019

(86) PCT No.: PCT/CN2019/112173
§ 371 (c)(1),
(2) Date: Jan. 8, 2020

(87) PCT Pub. No.: WO2020/258608
PCT Pub. Date: Dec. 30, 2020

(65) Prior Publication Data
US 2021/0408156 A1    Dec. 30, 2021

(30) Foreign Application Priority Data
Jun. 27, 2019  (CN) .......................... 201910564680.2

(51) Int. Cl.
*H01L 27/32*          (2006.01)

(52) U.S. Cl.
CPC ........ *H01L 27/3218* (2013.01); *H01L 27/326* (2013.01)

(58) Field of Classification Search
CPC ............. H01L 27/3218; H01L 27/3216; H01L 27/3211; H01L 27/326
USPC .......................................... 257/40; 438/82, 99
See application file for complete search history.

(56) References Cited

U.S. PATENT DOCUMENTS

| | | | |
|---|---|---|---|
| 10,269,873 B2 | 4/2019 | Kim et al. | |
| 10,566,399 B2 | 2/2020 | Li et al. | |
| 10,692,937 B2 | 6/2020 | Xia | |
| 2003/0227254 A1* | 12/2003 | Terumoto | H01L 27/3286 313/504 |
| 2010/0144072 A1 | 6/2010 | Lee et al. | |
| 2011/0095702 A1 | 4/2011 | Lee et al. | |
| 2015/0162390 A1* | 6/2015 | Wang | H01L 51/5284 257/40 |
| 2017/0076651 A1 | 3/2017 | Xu et al. | |
| 2019/0043407 A1* | 2/2019 | Yang | G09G 3/3208 |
| 2019/0044086 A1 | 2/2019 | Xia | |

(Continued)

FOREIGN PATENT DOCUMENTS

| | | |
|---|---|---|
| CN | 105140265 A | 12/2015 |
| CN | 106373982 A | 2/2017 |

(Continued)

*Primary Examiner* — Didarul A Mazumder

(57) ABSTRACT

The present invention provides a display panel and a display device, the display panel includes a first substrate; and a second substrate disposed opposite to the first substrate; and further includes two pixel layers, respectively a first pixel layer and a second a pixel layer; the first pixel layer is disposed on a surface of one side of the first substrate; and the second pixel layer is disposed on a surface of the second substrate facing the first pixel layer. The technical effect of the present invention is to improve the pixel resolution of the display panel.

8 Claims, 2 Drawing Sheets

(56) References Cited

U.S. PATENT DOCUMENTS

2019/0148466 A1* 5/2019 Guo .................. H01L 51/56
  345/694
2019/0386071 A1   12/2019 Xia
2020/0303470 A1    9/2020 Hsu
2021/0408156 A1   12/2021 Wang

FOREIGN PATENT DOCUMENTS

| CN | 106530989 A | 3/2017 |
| CN | 107706310 A | 2/2018 |
| CN | 107910454 A | 4/2018 |
| CN | 107946343 A | 4/2018 |
| CN | 108172694 A | 6/2018 |
| CN | 108511484 A | 9/2018 |
| CN | 108511508 A | 9/2018 |
| CN | 110265456 A | 9/2019 |
| JP | 2005174639 A | 6/2005 |
| KR | 100741968 B1 | 7/2007 |

* cited by examiner

DISPLAY PANEL INCLUDING MULTIPLE PIXEL UNITS AND DISPLAY DEVICE

FIELD OF INVENTION

The present invention relates to the field of display, and in particular, to a display panel and a display device.

BACKGROUND OF INVENTION

Organic electroluminescent diode (OLED) display has become the mainstream display product on the market due to its flexibility, self-illumination, wide viewing angles, etc. It is praised as the most promising display technology after the liquid crystal display (LCD). OLED light-emitting devices adopt a sandwich structure. Electrons and holes are injected into an organic light-emitting layer when current is applied to both ends, and different organic light-emitting materials emit different colors of light under excitons excitation, thereby the OLED light-emitting devices are applied to various display products.

With the improvement of the standard of living, electronic terminal products have higher requirements for the resolution of display panels, and the 4K and 8K resolutions concepts have been reported successively. Therefore, how to improve a pixel structure of the current display panel has become an urgent problem to be solved. In the conventional OLED panel, the pixel arrangement is mostly arranged by single-substrate RGB. This method requires high mask and evaporation process. The method of improving the resolution of the display panel is mainly by improving the mask and the evaporation process. However, as the requirement for resolution of the product increase, the pixel density becomes greater and greater, a mask and an evaporation process encounter bottleneck. A high-precision mask is easily broken during a stretching process, and color mixing is likely to occur during the evaporation process.

Technical Problem

An object of the present invention is to solve the technical problem that the resolution of the current display panel cannot meet the high-end requirements of a user.

SUMMARY OF INVENTION

To achieve the above object, the present invention provides a display panel, including: a first substrate; and a second substrate disposed opposite to the first substrate; two pixel layers including a first pixel layer and a second pixel layer; wherein the first pixel layer is disposed on a surface of one side of the first substrate; and the second pixel layer is disposed on a surface of the second substrate facing the first pixel layer.

Further, the pixel layers each includes a red sub-pixel, a green sub-pixel, and a blue sub-pixel.

Further, the red sub-pixel is square; the green sub-pixel is square, and the blue sub-pixel is rectangular.

Further, a side length of the red sub-pixel is equivalent to a side length of the green sub-pixel.

Further, a sum of areas of the red sub-pixel and the green sub-pixel in the pixel layer is equivalent to an area of the blue sub-pixel.

Further, two or more red sub-pixels and two or more green sub-pixels of the same pixel layer are disposed in a same line; a green sub-pixel is disposed between any two adjacent red sub-pixels, and two or more blue sub-pixels of the same pixel layer are disposed in a same line.

Further, the two adjacent red sub-pixel and green sub-pixel of one pixel layer are disposed opposite to the blue sub-pixel of another pixel layer.

Further, the display panel further includes: a first transparent electrode disposed between the first substrate and the first pixel layer; and a second transparent electrode disposed on a surface of the first pixel layer away from a side of the first transparent electrode.

Further, the display panel further includes: third transparent electrode layer disposed on a surface of the second pixel layer away from a side of the second substrate; reflective electrode disposed on a surface of the second pixel layer away from a side of the third transparent electrode layer; and mirror disposed between the second substrate and the reflective electrode.

To achieve the above object, the present invention also provides a display device including the display panel described above.

Beneficial Effect

The present invention provides a display panel and a display device. The display panel includes two pixel layers, a red sub-pixel and a green sub-pixel on any pixel layer can form a pixel unit with a blue sub-pixel of the same pixel layer or another pixel layer. It improves an arrangement of the pixel units, increases the number of pixel units, increases the pixel density per unit area, and significantly improves the resolution of the display device. The highest resolution of the display device of the present invention is twice the resolution of the prior art single substrate display device.

Figure 1:
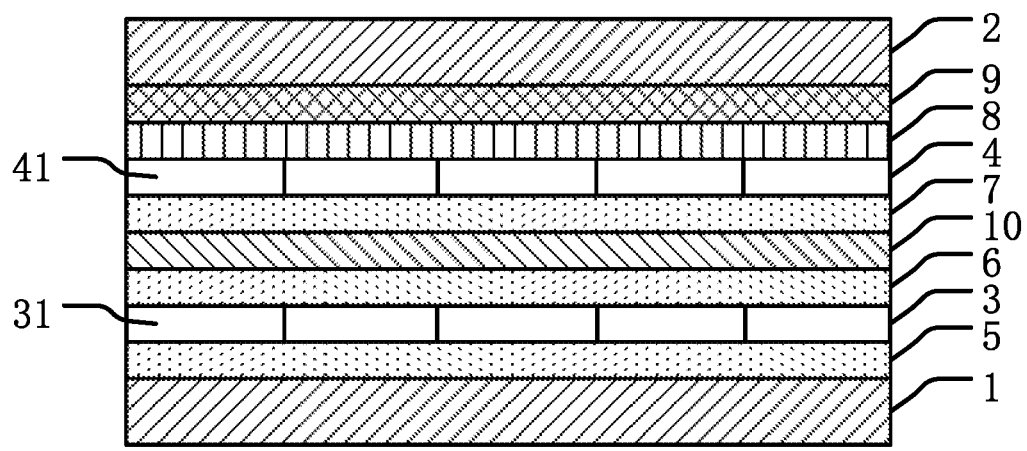
FIG. 1 is a schematic structural diagram of a display panel according to an embodiment of the present invention.

REFERENCE NUMERALS 1, first substrate; 2, second substrate; 3, first pixel layer; 4, second pixel layer; 5, first transparent electrode; 6, second transparent electrode; 7, third transparent electrode; 8, reflective electrode; 9, mirror; 10, transmission layer; 31, first pixel unit; 311, first blue sub-pixel; 312, first red sub-pixel; 313, first green sub-pixel; 41, second pixel unit; 411, second blue sub-pixel; 412, second red sub-pixel; 413, second green sub-pixel.

DETAILED DESCRIPTION OF PREFERRED EMBODIMENTS

The preferred embodiments of the present invention are described in detail below with reference to the drawings, and the technical contents of the present invention are fully described to exemplify the invention, such that those skilled in the art are easy to understand how to implement the invention. However, the present invention may be embodied in many different forms and embodiments, and the scope of the invention is not limited to the embodiments described herein.

The directional terms mentioned in the present invention, such as "upper", "lower", "front", "behind", "left", "right", "inside", "outside", "side", etc., are only refer to the directions of the accompanying drawings. The directional terms used herein are used to explain the invention and are not intended to limit the scope of the invention.

In the drawings, structurally identical components are denoted by the same reference numerals, and structural or functionally similar components are denoted by like reference numerals. In addition, the size and thickness of each component shown in the drawings are arbitrarily shown for ease of understanding and description, and the invention does not limit the size and thickness of each component.

When a component is described as "on" another component, the component can be placed directly on another component. There may also be an intermediate component, the component is placed on the intermediate component and the intermediate component is placed on another component. When a component is described as "installed to" or "connected to" another component, it can be understood as "installed to" or "connected to" directly, or a component is "installed to" or "connected to" another component by an intermediate component.

The embodiment provides a display device, including a display panel as shown in FIG. 1. The display panel includes a first substrate 1, a second substrate 2, a first pixel layer 3, a second pixel layer 4, a first transparent electrode 5, a second transparent electrode 6, a third transparent electrode 7, a reflective electrode 8, a mirror 9, and a transmission layer 10.

The first substrate 1 is disposed opposite to the second substrate 2, and the first substrate 1 is the same as the second substrate 2, preferably a TFT substrate, and provides circuit support for the entire display panel.

The first transparent electrode 5 is disposed on an upper surface of the first substrate 1, and the transparent electrode is also called a transparent conductive film (TCF). At present, it is mainly an ITO film, that is indium tin oxide.

Figure 2:
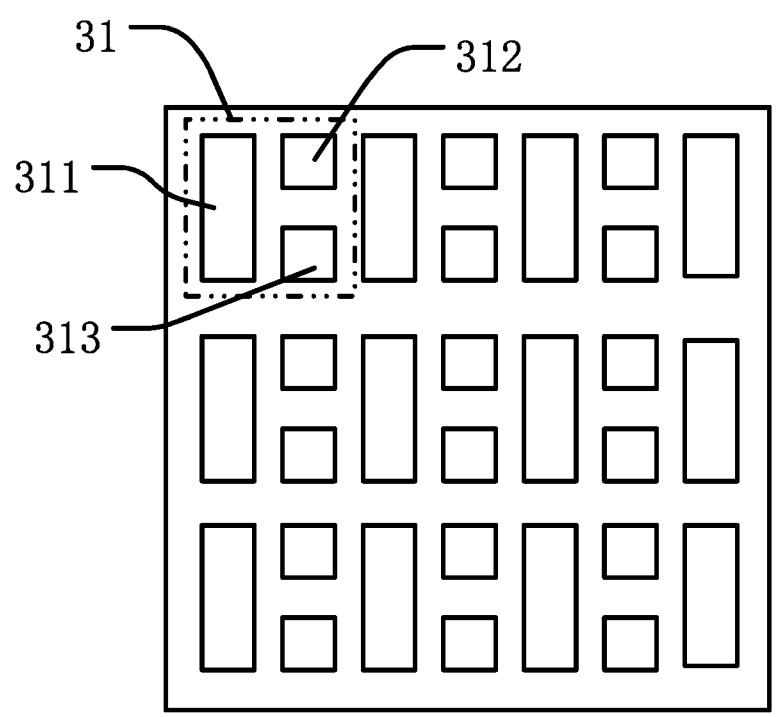
FIG. 2 is a diagram showing a pixel arrangement of a first pixel layer according to an embodiment of the present invention.

The first pixel layer 3 is disposed on an upper surface of the first transparent electrode 5. The first pixel layer 3 includes two or more first pixel units 31 (as shown in FIG. 2), and each of the first pixel units 31 includes a first blue sub-pixel 311, a first red sub-pixel 312, and a first green sub-pixel 313. The more the first pixel unit 31 on the first pixel layer 3, the higher the resolution of the display device.

As shown in FIG. 2, the first blue sub-pixel 311 is rectangular, the first red sub-pixel 312 is a square, and the first green sub-pixel 313 is square. A side length of the first red sub-pixel 312 is equivalent to a side length of the first green sub-pixel 313. A sum of areas of the first red sub-pixel 312 and the first green sub-pixel 313 in the pixel layer is equivalent to an area of the blue sub-pixel. Because there is a gap between each sub-pixel, the short side length of the first blue sub-pixel 311 is smaller than the side length of the first red sub-pixel 312 or the side length of the first green sub-pixel 313.

Two or more red sub-pixels 312 and green sub-pixels 313 of the first pixel layer 3 are disposed in a same line; a green sub-pixel 313 is disposed between any two adjacent red sub-pixels 312, and two or more blue sub-pixels 313 of the first pixel layer 3 are disposed in a same line. The line where the first red sub-pixel 312 and the first green sub-pixel 313 positioned in FIG. 2 is opposite to the line where the first blue sub-pixel 311 positioned, and they are disposed spaced apart. Such that the first red sub-pixel 312 and the first green sub-pixel 313 can not only be configured to form a first pixel unit 31 with the first blue sub-pixel 311 on the left side thereof, but also form the first pixel unit 31 with the first blue sub-pixel 311 on the right side thereof, increases the number of first pixel units 31 on the first pixel layer 3 and further improves the resolution of the display device.

The second transparent electrode 6 is disposed on an upper surface of the first pixel layer 3, and the transparent electrode is also called a transparent conductive film (TCF). At present, it is mainly an ITO film, that is indium tin oxide.

The first pixel layer 3 emits light under the action of the first transparent electrode 5 and the second transparent electrode 6. As shown in FIG. 1, a portion of the light is emitted downwardly to form a first beam, and another portion of the light is emitted upwardly to form a second beam. The first light beam is emitted downward and exits from the bottom of the first substrate 1. The second light beam is emitted upward, passes through the third transparent electrode 7 and the second pixel layer 4, and then is reflected downwardly by the mirror 9. Following it passes through the second pixel layer 4, the third transparent electrode 7, the transmission layer 10, the second transparent electrode 6, the first pixel layer 3, and the first transparent electrode 5. Finally, it exits from the bottom of the first substrate 1.

The mirror 9 is disposed on a lower surface of the second substrate 2 for reflecting light. The upward beam each is reflected downward such that all the beams are emitted from the bottom of the first substrate 1. The mirror 9 is a Bragg mirror (also known as distributed Bragg reflector), which is a mirror structure, including an adjustable multilayer structure composed of two optical materials. The most common is a quarter mirror where each layer has a thickness corresponding to a quarter of the wavelength. The latter condition is suitably used in a situation of normal incidence, and if the mirror is used for larger angles of incidence, the corresponding required layer thickness is thicker. Fresnel reflection occurs at each interface site of the two materials. When at the working wavelength, the optical path difference of the reflected light at two adjacent interface sites is half of a wavelength, and the reflection coefficient at the interface site also changes. Therefore, all the reflected light at the interface sites occurs destructive interference, resulting in a strong reflection. The reflectivity is determined by the number of layers of material and the difference in refractive index between the materials. The reflection bandwidth is mainly determined by the refractive index difference. Bragg's law assumes that incident waves are specularly reflected from parallel atomic planes in the crystal, each plane reflects a small fraction of radiation, like a slightly silver-plated mirror. In this mirror-like specular reflection, the reflection angle thereof is equal to the incidence angle thereof. When the reflected light from the parallel atomic plane occurs constructive interference, a diffracted beam is obtained.

The reflective electrode 8 is disposed on a lower surface of the mirror 9 such that the second pixel layer 4 emits light, and the emitted second light beam exits downward, thereby, all the light beams exit from the bottom of the first substrate 1.

Figure 3:
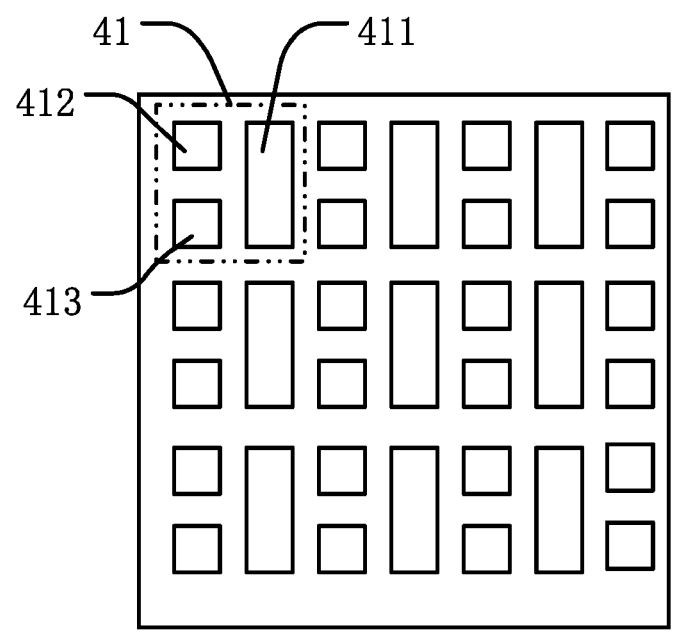
FIG. 3 is a diagram showing a pixel arrangement of a second pixel layer according to an embodiment of the invention.

The second pixel layer 4 is disposed on a lower surface of the reflective electrode 8, and the second pixel layer 4 includes two or more second pixel units 41 (as shown in FIG. 3). Each of the second pixel units 41 includes a second blue sub-pixel 411, a second red sub-pixel 412, and a second green sub-pixel 413. The more the second pixel unit 41 on the second pixel layer 4, the higher the resolution of the display device.

As shown in FIG. 3, the second blue sub-pixel 411 is a rectangle, the second red sub-pixel 412 is a square, the second green sub-pixel 413 is a square, and the second red sub-pixel 412 has a side length equal to a side length of the second green sub-pixel 413. A sum of areas of the second red sub-pixel 412 and the second green sub-pixel 413 is equivalent to an area of the second blue sub-pixel 411. Since there is a gap between each sub-pixel, a short side length of the second blue sub-pixel 411 is smaller than a side length of the second red sub-pixel 412 or a side length of the second green sub-pixel 413.

The two or more second red sub-pixels 412 and the second green sub-pixels 413 of the second pixel layer 4 are disposed in a same line, and one second green sub-pixel 413 is disposed between any two of the second red sub-pixels 412. Two or more second blue sub-pixels 413 of the second pixel layer 4 are disposed in a same line. The line where the second red sub-pixel 412 and the second green sub-pixel 413 positioned in FIG. 3 is opposite to the line where the second blue sub-pixel 411 positioned, and they are disposed spaced apart. Such that the second red sub-pixel 412 and the second green sub-pixel 413 can not only be configured to form a second pixel unit 41 with the second blue sub-pixel 411 on the left side thereof, but also form the second pixel unit 41 with the second blue sub-pixel 411 on the right side thereof, increases the number of second pixel units 41 on the second pixel layer 4 and further improves the resolution of the display device.

The second pixel layer 4 is disposed opposite to the first pixel layer 3, and the first red sub-pixel 312 and the first green sub-pixel 313 disposed on the first pixel layer 3 are opposite to the second blue sub-pixel 411 disposed on the second pixel layer 4. The area of the second blue sub-pixel 411 disposed on the second pixel layer 4 is equal to the sum of the area of the first red sub-pixel 312 and the area of the first green sub-pixel 313 disposed on the first pixel layer 3. That is, the first red sub-pixel 312 and the first green sub-pixel 313 on the first pixel layer 3 can form a new pixel unit with the second blue sub-pixel 411 on the second pixel layer 4. The dual-layer pixel layer described in this embodiment makes the effective pixel density of the display panel as double as that of the single-pixel layer display panel and theoretically can double the resolution of the display device.

The second red sub-pixel 412 and the second green sub-pixel 413 on the second pixel layer 4 are disposed opposite to the first blue sub-pixel 311 on the first pixel layer 3, and the area of the first blue sub-pixel 311 on the first pixel layer 3 is equivalent to the sum of the area of the second red sub-pixel 412 and the area of the second green sub-pixel 413 on the second pixel layer 4. That is, the second red sub-pixel 412 and the second green sub-pixel 413 on the second pixel layer 4 may form a new pixel unit with the first blue sub-pixel 311 on the first pixel layer 3. The dual-layer pixel layer described in this embodiment makes the effective pixel density of the display panel as double as that of the single-pixel layer display panel and theoretically can double the resolution of the display device.

The third transparent electrode 7 is disposed on a lower surface of the second pixel layer 4, and the transparent electrode is also called a transparent conductive film (TCF). At present, it is mainly an ITO film, that is indium tin oxide.

The second pixel layer 4 emits light under the action of the third transparent electrode 7 and the reflective electrode 8. As shown in FIG. 1, a portion of the light is emitted downwardly to form a third beam, and another portion of the light is emitted upwardly to form a fourth beam. The third light beam passes through the second pixel layer 4, the third transparent electrode 7, the second transparent electrode 6, the first pixel layer 3, and the first transparent electrode 5, and exits from the bottom of the first substrate 1. The first light beam is reflected downwardly by the mirror 9 and passes through the second pixel layer 4, the third transparent electrode 7, the transmissive layer 10, the second transparent electrode 6, the first pixel layer 3, and the first transparent electrode 5, and exits from the bottom of the first substrate 1.

The first pixel layer 3 emits light to form a first light beam and a second light beam, and the second pixel layer emits light to form a third light beam and a fourth light beam, all the light beams are emitted from the bottom of the first substrate 1 to further enhance the brightness of the display panel.

In theory, the use of a dual-pixel layer can double the brightness and resolution of the display panel compared to the current single-pixel layer display panel. In fact, the brightness and resolution of the dual-pixel layer display panel can be increased by 30% to 60% compared with the current single-pixel layer display panel because of the light transmittance limitation of each transparent layer during the beam propagation process and loss of light due to refraction.

The transmission layer 10 is disposed between the second transparent electrode 6 and the third transparent electrode 7. The material of the transmission layer 10 is a high transmittance material, which functions to increase the amount of light emitted from the display panel and protect the first substrate 1 and the second substrate 2 so that the two substrates are more closely attached.

The display panel of the present embodiment further includes a plurality of organic layers, which are a hole injection layer, a hole transport layer, an electron transport layer, an electron injection layer, and the like, which are not specifically described herein.

The technical effect of the display device of the embodiment is that the display panel includes two pixel layers, a red sub-pixel and a green sub-pixel on any pixel layer can form a pixel unit with a blue sub-pixel of the same pixel layer or another pixel layer. It improves an arrangement of the pixel units, increases the number of pixel units, increases the pixel density per unit area, and significantly improves the resolution of the display device. Moreover, the display panel of the embodiment does not need to increase the mask and the evaporation process, thereby improving the preparation efficiency of the display device.

The description of the above exemplary embodiments is only for the purpose of understanding the invention. It is to be understood that the present invention is not limited to the disclosed exemplary embodiments. It is obvious to those skilled in the art that the above exemplary embodiments may be modified without departing from the scope and spirit of the present invention.

What is claimed is:

1. A display panel, comprising:
   a first substrate;
   a second substrate disposed opposite to the first substrate;
   two pixel layers comprising a first pixel layer and a second pixel layer, wherein the first pixel layer is disposed on a surface of one side of the first substrate, and the second pixel layer is disposed on a surface of the second substrate facing the first pixel layer;
   a first transparent electrode disposed between the first substrate and the first pixel layer; and
   a second transparent electrode disposed on a surface of the first pixel layer away from a side of the first transparent electrode;

a third transparent electrode layer disposed on a surface of the second pixel layer away from a side of the second substrate;

a reflective electrode disposed on a surface of the second pixel layer away from a side of the third transparent electrode layer; and a mirror disposed between the second substrate and the reflective electrode.

2. The display panel according to claim 1, wherein the pixel layers each includes a red sub-pixel, a green sub-pixel, and a blue sub-pixel.

3. The display panel according to claim 2, wherein the red sub-pixel is square, the green sub-pixel is square, and the blue sub-pixel is rectangular.

4. The display panel according to claim 2, wherein a side length of the red sub-pixel is equivalent to a side length of the green sub-pixel.

5. The display panel according to claim 2, wherein a sum of areas of the red sub-pixel and the green sub-pixel is equivalent to an area of the blue sub-pixel.

6. The display panel according to claim 1, wherein two or more red sub-pixels and two or more green sub-pixels of the same pixel layer are disposed in a same line; a green sub-pixel is disposed between any two adjacent red sub-pixels, and two or more blue sub-pixels of the same pixel layer are disposed in a same line.

7. The display panel according to claim 2, wherein the two adjacent red sub-pixel and green sub-pixel of one pixel layer are disposed opposite to the blue sub-pixel of another pixel layer.

8. A display device, comprising the display panel of claim 1.

* * * * *